(12) United States Patent
Jimenez et al.

(10) Patent No.: US 10,446,544 B2
(45) Date of Patent: Oct. 15, 2019

(54) ENHANCEMENT-MODE/DEPLETION-MODE FIELD-EFFECT TRANSISTOR GAN TECHNOLOGY

(71) Applicant: Qorvo US, Inc., Greensboro, NC (US)

(72) Inventors: Jose Jimenez, Dallas, TX (US); Jinqiao Xie, Allen, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/001,996

(22) Filed: Jun. 7, 2018

(65) Prior Publication Data

US 2018/0358357 A1 Dec. 13, 2018

Related U.S. Application Data

(60) Provisional application No. 62/516,963, filed on Jun. 8, 2017.

(51) Int. Cl.
*H01L 29/10* (2006.01)
*H01L 27/088* (2006.01)
*H01L 27/085* (2006.01)
*H01L 29/417* (2006.01)
*H01L 29/36* (2006.01)
*H01L 29/205* (2006.01)
*H01L 21/306* (2006.01)
*H01L 21/8252* (2006.01)
*H01L 21/762* (2006.01)
(Continued)

(52) U.S. Cl.
CPC ........ *H01L 27/085* (2013.01); *H01L 21/0254* (2013.01); *H01L 21/02458* (2013.01); *H01L 21/30612* (2013.01); *H01L 21/76224* (2013.01); *H01L 21/8252* (2013.01); *H01L 27/0605* (2013.01); *H01L 29/0653* (2013.01); *H01L 29/0843* (2013.01); *H01L 29/1029* (2013.01); *H01L 29/1075* (2013.01); *H01L 29/1095* (2013.01); *H01L 29/122* (2013.01); *H01L 29/205* (2013.01); *H01L 29/36* (2013.01); *H01L 29/4175* (2013.01); *H01L 29/66462* (2013.01); *H01L 29/7786* (2013.01); *H01L 29/7787* (2013.01); *H01L 27/0883* (2013.01); *H01L 29/2003* (2013.01)

(58) Field of Classification Search
CPC .......................... H01L 29/122; H01L 27/0083
USPC .......................................... 257/194; 438/172
See application file for complete search history.

(56) References Cited

U.S. PATENT DOCUMENTS 5,514,605 A * 5/1996 Asai .................... H01L 21/8252
257/E21.697
2010/0102397 A1* 4/2010 Park ................ H01L 21/823412
257/392
(Continued)

*Primary Examiner* — David Vu
*Assistant Examiner* — Brandon C Fox
(74) *Attorney, Agent, or Firm* — Withrow & Terranova, P.L.L.C.

(57) ABSTRACT

An integrated circuit die having a substrate with a first device stack disposed upon the substrate and a second device stack spaced from the first device stack and disposed upon the substrate is disclosed. The second device stack includes a first portion of a channel layer and a threshold voltage shift layer disposed between the first portion of the channel layer and the substrate, wherein the threshold voltage shift layer is configured to set a threshold voltage that is a minimum device control voltage required to create a conducting path within the first portion of the channel layer.

24 Claims, 5 Drawing Sheets

(51) Int. Cl.
*H01L 29/08* (2006.01)
*H01L 21/02* (2006.01)
*H01L 29/06* (2006.01)
*H01L 29/778* (2006.01)
*H01L 29/66* (2006.01)
*H01L 29/12* (2006.01)
*H01L 27/06* (2006.01)
*H01L 29/20* (2006.01)

(56) References Cited

U.S. PATENT DOCUMENTS

2013/0161698 A1* 6/2013 Marino ............. H01L 29/42316
　　　　　　　　　　　　　　　　　　　　　257/194
2013/0313561 A1* 11/2013 Suh ....................... H01L 29/402
　　　　　　　　　　　　　　　　　　　　　257/76

* cited by examiner

ENHANCEMENT-MODE/DEPLETION-MODE FIELD-EFFECT TRANSISTOR GAN TECHNOLOGY

RELATED APPLICATIONS

This application claims the benefit of provisional patent application Ser. No. 62/516,963, filed Jun. 8, 2017, the disclosure of which is hereby incorporated herein by reference in its entirety.

FIELD OF THE DISCLOSURE

This disclosure relates to semiconductor devices and methods for manufacturing the same.

BACKGROUND

Fabricating high bandgap-type enhancement-mode and depletion-mode field-effect devices that share at least some device stack layers within an integrated circuit die has not been commercially feasible heretofore. At least one reason for the lack of this commercial feasibility is that fabrication techniques using etch stop layers to fabricate lower bandgap types of enhancement-mode and depletion-mode field-effect devices are not as practical for fabricating high bandgap devices such as gallium nitride-based devices. What is needed is an integrated circuit die and method that realizes enhancement-mode and depletion-mode field-effect devices of a high bandgap type that share at least some device stack layers within an integrated circuit die without using etch stop layers during fabrication.

SUMMARY

An integrated circuit die having a substrate with a first device stack disposed upon the substrate and a second device stack spaced from the first device stack and disposed upon the substrate is disclosed. The second device stack includes a first portion of a channel layer and a threshold voltage shift layer disposed between the first portion of the channel layer and the substrate, wherein the threshold voltage shift layer is configured to set a threshold voltage that is a minimum device control voltage required to create a conducting path within the first portion of the channel layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
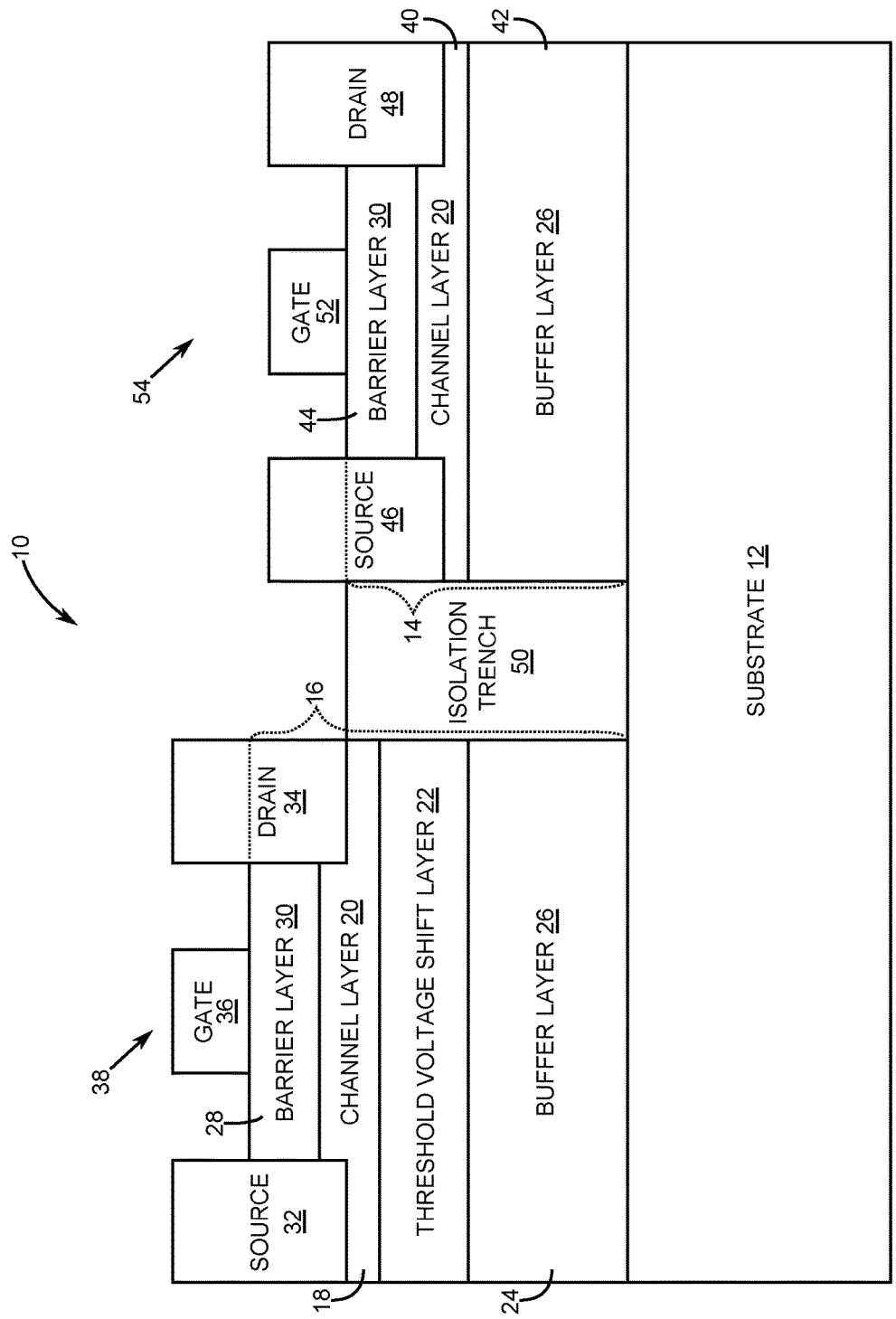
FIG. 1 is a cross-sectional diagram of an exemplary integrated circuit die having an enhancement-mode device and a depletion-mode device structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a cross-sectional diagram of an exemplary integrated circuit die 10 that is structured in accordance with the present disclosure. The integrated circuit die 10 has a substrate 12 with a first device stack 14 disposed upon the substrate 12 and a second device stack 16 spaced from the first device stack 14 and disposed upon the substrate 12. The second device stack 16 includes a first portion 18 of a channel layer 20 and a threshold voltage shift layer 22 disposed between the first portion 18 of the channel layer 20 and the substrate 12, wherein the threshold voltage shift layer 22 is configured to set a threshold voltage that is a minimum device control voltage required to create a conducting path within the first portion 18 of the channel layer 20. In at least some embodiments, the threshold voltage shift layer 22 is made of a first semiconductor material having a first bandgap that is higher than a second bandgap of a second semiconductor material making up the channel layer 20.

In the exemplary embodiment of FIG. 1, the second device stack 16 further includes a first portion 24 of a buffer layer 26 that is disposed between the threshold voltage shift layer 22 and the substrate 12. Also, a first portion 28 of a barrier layer 30 is disposed over the first portion 18 of the channel layer 20. A first source 32 and a first drain 34 are disposed over the first portion 18 of the channel layer 20, and a first gate 36 is disposed over the first portion 28 of the barrier layer 30 to realize a first field-effect device 38.

Moreover, the first device stack 14 includes a second portion 40 of the channel layer 20 that is disposed over a second portion 42 of the buffer layer 26. A second portion 44 of the barrier layer 30 is disposed over the channel layer 20. A second source 46 and a second drain 48 are disposed over the second portion 40 of the channel layer 20, and a second gate 52 is disposed over the second portion 44 of the barrier layer 30 to realize a second field-effect device 54. An isolation trench 50 isolates the first field-effect device 38 from the second field-effect device 54.

Figure 2:
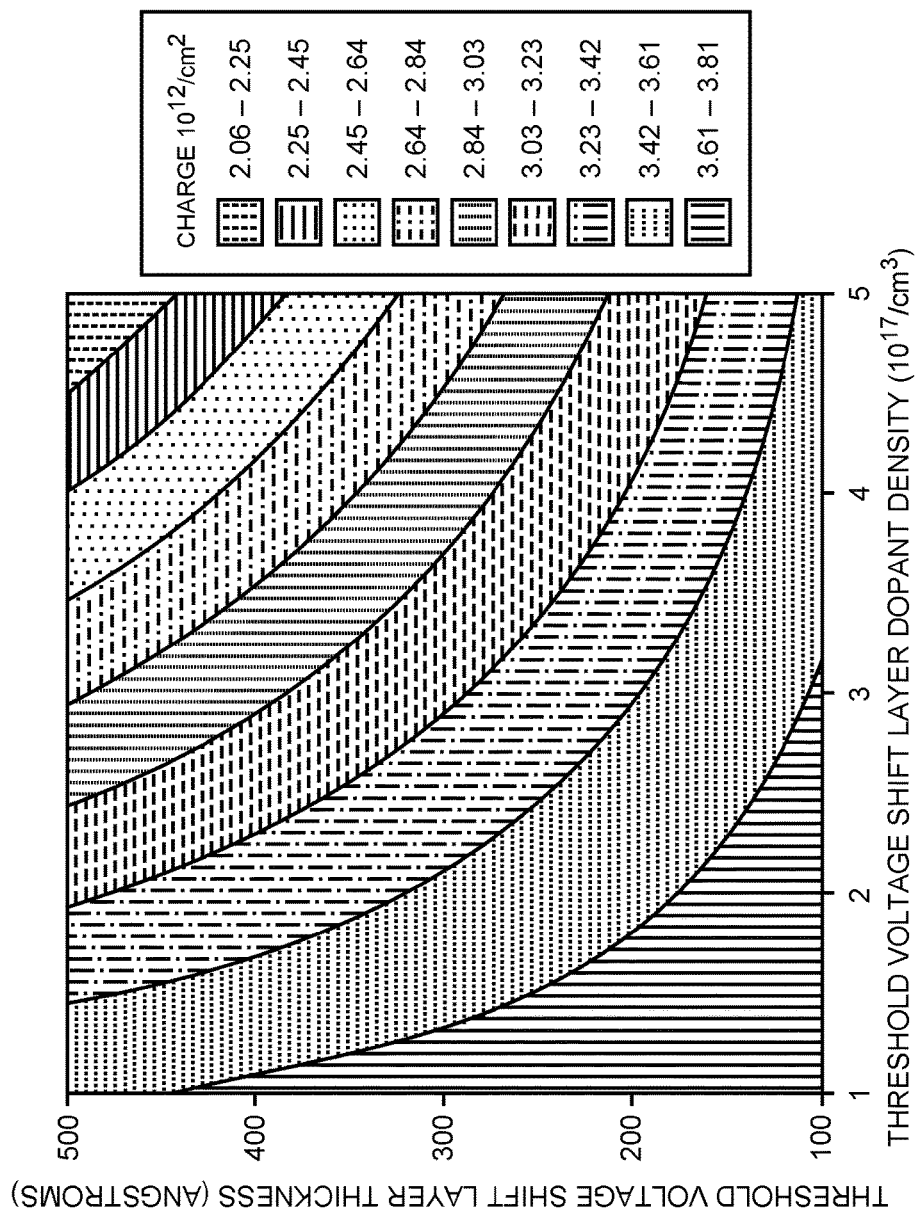
FIG. 2 is a graph depicting sheet charge for threshold voltage shift layer thickness versus threshold voltage shift layer dopant density.

FIG. 2 is a graph depicting sheet charge for threshold voltage shift layer thickness versus threshold voltage shift layer dopant density. In some exemplary embodiments of the integrated circuit die 10 (FIG. 1), a predetermined thickness for the threshold voltage shift layer 22 is within a range of thicknesses from 100 Å to 300 Å. In other exemplary embodiments of the integrated circuit die 10, a predetermined thickness for the threshold voltage shift layer 22 is within a range of thicknesses from 300 Å to 500 Å. In some exemplary embodiments of the integrated circuit die 10, a predetermined dopant density is within a range of dopant densities from $1 \times 10^{17}/cm^3$ to $3 \times 10^{17}/cm^3$. In other exemplary embodiments of the integrated circuit die 10, a predetermined dopant density is within a range of dopant densities from $3 \times 10^{17}/cm^3$ to $5 \times 10^{17}/cm^3$. Sheet charge ranges from $2.06 \times 10^{12}/cm^2$ to $3.81 \times 10^{1}/cm^2$ in the graph of FIG. 2. These sheet charge values are exemplary, and other sheet charge values that fall outside of the graph of FIG. 2 exist. Sheet charge is also a function of the type of dopant added to the threshold voltage shift layer 22. Exemplary dopants for gallium nitride are silicon for an n-type dopant and magnesium for a p-type dopant. Sheet charge determines a threshold voltage shift ($\Delta$) provided by the threshold voltage shift layer 22.

Figure 3:
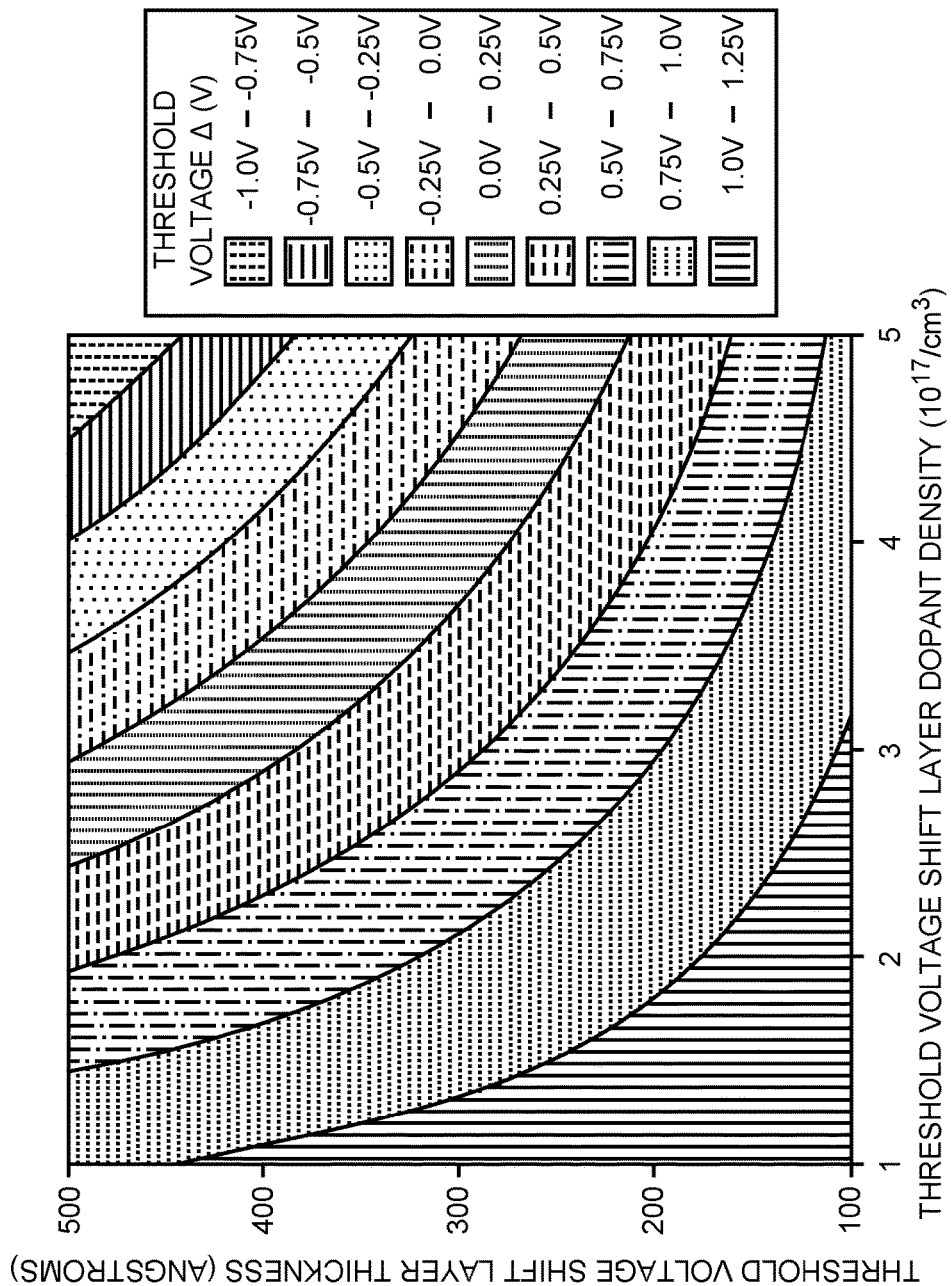
FIG. 3 is a graph depicting threshold voltage shift for threshold voltage shift layer thickness versus threshold voltage shift layer dopant density.

In this regard, FIG. 3 is a graph depicting threshold voltage $\Delta$ for threshold voltage shift layer thickness versus threshold voltage shift layer dopant density. A threshold voltage for the first-field effect device 38 is determined by both the predetermined thickness of the threshold voltage shift layer 22 and the predetermined dopant density of the threshold voltage shift layer 22. Threshold voltage $\Delta$ ranges from −1.0 V to 1.25 V in the graph of FIG. 3. These threshold voltage $\Delta$ values are exemplary, and other threshold voltage $\Delta$ values fall outside of the graph of FIG. 3 as they are associated with sheet charge values that fall outside of the graph of FIG. 2.

Figure 4:
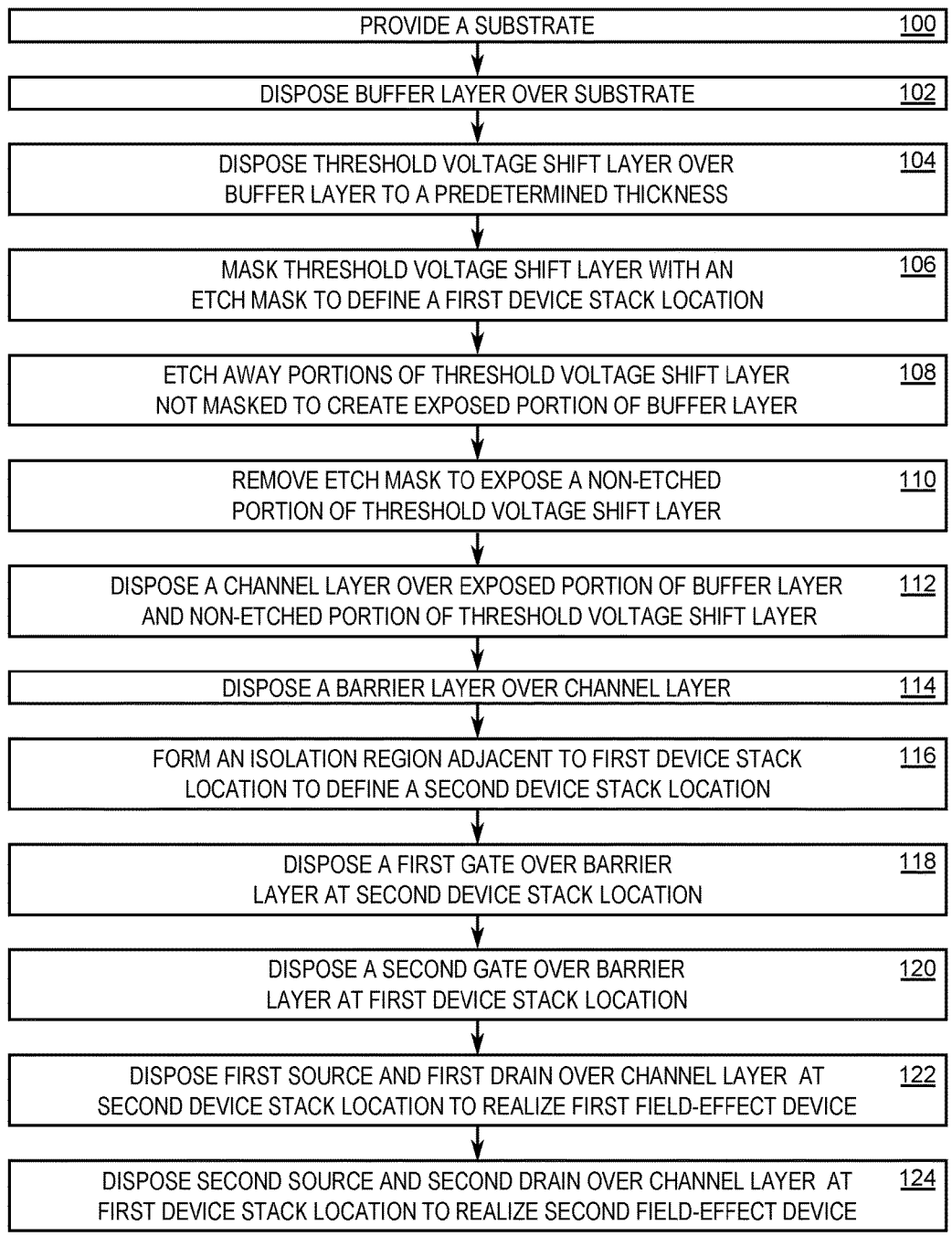
FIG. 4 is a process flow chart for an exemplary method of manufacture for the integrated circuit die of FIG. 1.

FIG. 4 is a process flow chart for an exemplary method of manufacture for the integrated circuit die 10 of FIG. 1. The exemplary method of manufacture comprises semiconductor processes that include but are not limited to deposition of materials to form layers such as the buffer layer 26, masking layers such as the threshold voltage shift layer 22 with etch masks, and etching layers such as the threshold voltage shift layer 22. Disposing a layer over another layer may be accomplished using semiconductor fabrication processes such as molecular beam epitaxy and chemical vapor deposition. Masking may be accomplished using semiconductor fabrication processes common in photolithography, and etching of layers such as the threshold voltage shift layer 22 may be accomplished using chemical etching, mechanical etching, and chemical-mechanical polishing.

A first step in the process is to provide the substrate 12 (step 100). Exemplary substrates include but are not limited to handle wafers made of silicon, silicon carbide, and sapphire. In fabricating an exemplary gallium nitride (GaN) embodiment of the integrated circuit die 10, the substrate 12 is silicon carbide. A next exemplary step is to dispose the buffer layer 26 over the substrate 12 (step 102). In the exemplary embodiment, the buffer layer 26 is made of GaN.

A following step is to dispose the threshold voltage shift layer 22 over the substrate 12 and buffer layer 26 to a predetermined thickness (step 104). For example, the predetermined thickness may be 300 Å with a predetermined dopant density of $3 \times 10^{17}/cm^3$.

Another step is to mask the threshold voltage shift layer 22 with an etch mask to define a location of the first device stack 14 (step 106). A next step is to etch away portions of the threshold voltage shift layer 22 that are not masked to create an exposed portion of the buffer layer 26 (step 108).

A following step is to remove the etch mask to expose a non-etched portion of the threshold voltage shift layer 22 (step 110). Then a step is taken to dispose the channel layer 20 over the exposed portion of the buffer layer 26 and the non-etched portion of the threshold voltage shift layer 22 (step 112). A next step is to dispose the barrier layer 30 over the channel layer 20 (step 114).

At this point, a next step is to form the isolation trench 50 adjacent to the first device stack location to define a second device stack location (step 116). A suitable semiconductor manufacturing technique for forming the isolation trench 50 is known as shallow trench isolation. The isolation trench is filled with an isolation oxide that separates and electrically isolates the first device stack 14 from the second device stack 16.

Some finishing steps may occur concurrently and may also include various masking and etching steps. These finishing steps also include a step to dispose the first gate 36 over the barrier layer 30 at the second device stack location (step 118). A further step is to dispose the second gate 52 over the barrier layer 30 at the first device stack location (step 120). Another step is to dispose the first source 32 and the first drain 34 over the channel layer at the second device stack location to realize the first field-effect device 38 (step 122). Yet another step is to dispose the second source 46 and the second drain 48 over the channel layer 20 at the first device stack location to realize the second field-effect device 54 (step 124). It is to be understood that other practical order of steps will occur to those skilled in the art. It should also be noted that the inclusion of the threshold voltage shift layer 22 makes etch stop layers unnecessary for realizing an enhancement-mode (E-mode) field-effect device and a depletion-mode (D-mode) field-effect device in a same integrated circuit die, such as integrated circuit die 10.

Depending on the polarity of the devices, either the first field-effect device 38 is the E-mode field-effect device and the second field-effect device 54 is the D-mode field-effect device, or the first field-effect device 38 is the D-mode field-effect device and the second field-effect device 54 is the E-mode device. Moreover, any number of field-effect devices of the E-mode and D-mode types may be fabricated into an integrated circuit die using the method of manufacture of the present disclosure.

Figure 5:
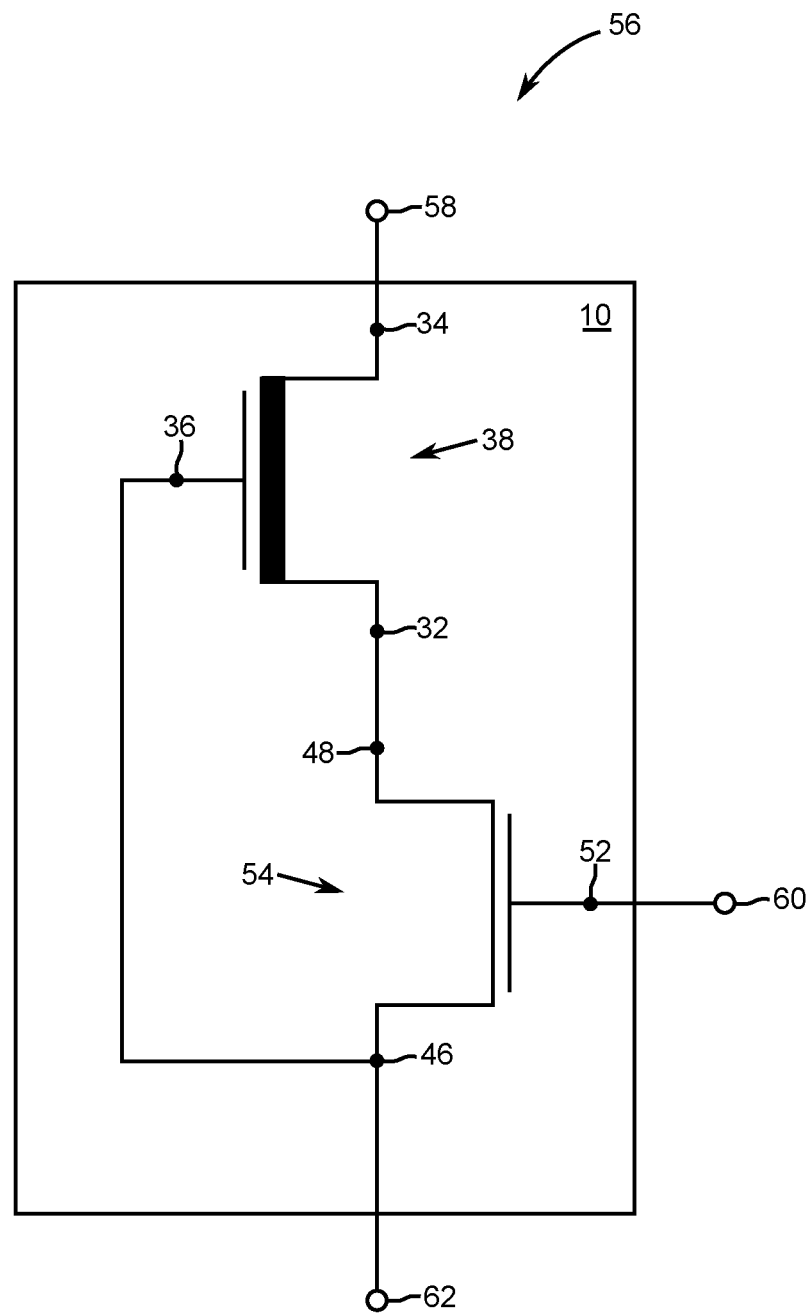
FIG. 5 is a schematic diagram of an exemplary switch circuit constructed from the enhancement-mode device and the depletion-mode device that is fabricated on the integrated circuit die of FIG. 1.

FIG. 5 is a schematic diagram of an exemplary switch circuit 56 constructed from the first field-effect device 38 and the second field-effect device 54 that are fabricated on the integrated circuit die 10 of FIG. 1. In this exemplary case, the first field-effect device 38 is a D-mode GaN transistor and the second field-effect device 54 is an E-mode GaN transistor. In this exemplary embodiment of the integrated circuit die 10 configured as the switch circuit 56, the second drain 48 of the first field-effect device 38 is coupled to an external drain terminal 58, whereas the second gate 52 is coupled to an external gate terminal 60. An external source terminal 62 is coupled to the second source 46, which in turn, in this exemplary case, is coupled to the first gate 36 to configure the integrated circuit die 10 into the switch circuit 56. It is to be understood that the integrated circuit die 10 of the present disclosure can be configured into other circuitries of various complexities such as radio frequency amplifiers.

Those skilled in the art will recognize improvements and modifications to the preferred embodiments of the present disclosure. All such improvements and modifications are considered within the scope of the concepts disclosed herein and the claims that follow.

What is claimed is:

1. An integrated circuit die comprising:
    a substrate;
    a first device stack disposed upon the substrate; and
    a second device stack spaced from the first device stack and disposed upon the substrate, the second device stack comprising:
        a first portion of a channel layer; and
        a threshold voltage shift layer disposed between the first portion of the channel layer portion and the substrate, wherein the threshold voltage shift layer is configured to set a first threshold voltage that is a minimum device control voltage required to create a conducting path within the first portion of the channel layer, wherein the threshold voltage shift layer is made of a first semiconductor material having a first bandgap that is higher than a second bandgap of a second semiconductor material making up the channel layer.

2. The integrated circuit die of claim 1 wherein the first device stack comprises an enhancement-mode (E-mode) field-effect device and the second stack device comprises a depletion-mode (D-mode) field-effect device.

3. The integrated circuit die of claim 1 wherein the first device stack comprises a D-mode field-effect device and the second stack device comprises an E-mode field-effect device.

4. The integrated circuit die of claim 1 wherein the first threshold voltage is determined by a predetermined thickness of the threshold voltage shift layer.

5. The integrated circuit die of claim 4 wherein the predetermined thickness is within a range of thicknesses from 100 Å to 300 Å.

6. The integrated circuit die of claim 4 wherein the predetermined thickness is within a range of thicknesses from 300 Å to 500 Å.

7. The integrated circuit die of claim 1 wherein the first threshold voltage is determined by a predetermined dopant density within the threshold voltage shift layer.

8. The integrated circuit die of claim 7 wherein the predetermined dopant density is within a range of dopant densities from $1\times10^{17}/cm^3$ to $3\times10^{17}/cm^3$.

9. The integrated circuit die of claim 7 wherein the predetermined dopant density is within a range of dopant densities from $3\times10^{17}/cm^3$ to $5\times10^{17}/cm^3$.

10. The integrated circuit die of claim 1 wherein the first threshold voltage is determined by both a predetermined thickness of the threshold voltage shift layer and a predetermined dopant density of the threshold voltage shift layer.

11. The integrated circuit die of claim 1 wherein the first device stack and the second device stack are both gallium nitride based.

12. The integrated circuit die of claim 1 wherein the second device stack has a second threshold voltage that is opposite in polarity from the first threshold voltage of the first device stack.

13. A method of fabricating an integrated circuit die comprising:
    providing a substrate;
    disposing a buffer layer over the substrate;
    disposing a threshold voltage shift layer over the buffer layer to a predetermined thickness;
    masking the threshold voltage shift layer with an etch mask to define a first device stack location;
    etching through the threshold voltage shift layer not masked by the etch mask to create an exposed portion of the buffer layer;
    removing the etch mask to expose a non-etched portion of the threshold voltage shift layer;
    disposing a channel layer over the exposed portion of the buffer layer and the non-etched portion of the threshold voltage shift layer, wherein the threshold voltage shift layer is configured to set a first threshold voltage that is a minimum device control voltage required to create a conducting path within a portion of the channel layer residing over the non-etched portion of the threshold voltage shift layer.

14. The method of fabricating the integrated circuit die of claim 13 further comprising:
    disposing a barrier layer over the channel layer;

forming an isolation region adjacent to the first device stack location to define a second device stack location spaced from the first device stack location;

disposing a first gate over the barrier layer at the first device stack location; and disposing a second gate over the barrier layer at the second device stack location.

15. The method of fabricating the integrated circuit die of claim 14 further comprising:

disposing a first source over the channel layer at the first device stack location, wherein the first source is spaced from the first gate;

disposing a first drain over the channel layer at the first device stack location, wherein the first drain is spaced from both the first gate and the first source to realize a first field-effect device;

disposing a second source over the channel layer at the second device stack location, wherein the second source is spaced from the second gate; and disposing a second drain over the channel layer at the second device stack location, wherein the second drain is spaced from both the second gate and the second source to realize a second field-effect device.

16. The method of fabricating the integrated circuit die of claim 14 wherein the first device stack comprises an enhancement-mode (E-mode) field-effect device and the second stack device comprises a depletion-mode (D-mode) field-effect device.

17. The method of fabricating the integrated circuit die of claim 14 wherein the first device stack comprises a D-mode field-effect device and the second stack device comprises an E-mode field-effect device.

18. The method of fabricating the integrated circuit die of claim 14 wherein the second device stack has a second threshold voltage that is opposite in polarity from the first threshold voltage of the first device stack.

19. The method of fabricating the integrated circuit die of claim 13 wherein the first threshold voltage is determined by a predetermined thickness of the threshold voltage shift layer.

20. The method of fabricating the integrated circuit die of claim 19 wherein the predetermined thickness is within a range of thicknesses from 100 Å to 500 Å.

21. The method of fabricating the integrated circuit die of claim 13 wherein the first threshold voltage is determined by a predetermined dopant density within the threshold voltage shift layer.

22. The method of fabricating the integrated circuit die of claim 21 wherein the predetermined dopant density is within a range of dopant densities from $1 \times 10^{17}/cm^3$ to $5 \times 10^{17}/cm^3$.

23. The method of fabricating the integrated circuit die of claim 13 wherein the threshold voltage shift layer is made of a first semiconductor material having a first bandgap that is higher than a second bandgap of a second semiconductor material making up the channel layer.

24. The method of fabricating the integrated circuit of claim 13 wherein the buffer layer is made of gallium nitride.

* * * * *